United States Patent
Min et al.

(10) Patent No.: US 11,309,476 B2
(45) Date of Patent: Apr. 19, 2022

(54) CHALCOGEN-CONTAINING COMPOUND, ITS PREPARATION METHOD AND THERMOELECTRIC ELEMENT COMPRISING THE SAME

(71) Applicant: LG CHEM, LTD., Seoul (KR)

(72) Inventors: Yu Ho Min, Daejeon (KR); Min Kyoung Kim, Daejeon (KR); Cheol Hee Park, Daejeon (KR); Kyung Moon Ko, Daejeon (KR); Chee Sung Park, Daejeon (KR); Myung Jin Jung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 793 days.

(21) Appl. No.: 16/310,554

(22) PCT Filed: Mar. 19, 2018

(86) PCT No.: PCT/KR2018/003181
§ 371 (c)(1),
(2) Date: Dec. 17, 2018

(87) PCT Pub. No.: WO2018/212441
PCT Pub. Date: Nov. 22, 2018

(65) Prior Publication Data
US 2019/0334070 A1  Oct. 31, 2019

(30) Foreign Application Priority Data

May 15, 2017  (KR) ......................... 10-2017-0060148

(51) Int. Cl.
  *H01L 35/16*  (2006.01)
  *C01B 19/00*  (2006.01)
  *H01L 35/34*  (2006.01)

(52) U.S. Cl.
  CPC ............ *H01L 35/16* (2013.01); *C01B 19/002* (2013.01); *H01L 35/34* (2013.01); *C01P 2006/32* (2013.01); *C01P 2006/40* (2013.01)

(58) Field of Classification Search
  CPC ....... H01L 35/16; H01L 35/34; C01B 19/002; C01B 19/00; C01P 2006/32; C01P 2006/40
  See application file for complete search history.

(56) References Cited

U.S. PATENT DOCUMENTS 6,013,204 A  1/2000  Kanatzidis et al.
6,312,617 B1  11/2001  Kanatzidis et al.
(Continued)

FOREIGN PATENT DOCUMENTS

CN  102099937 A  6/2011
CN  104716254 A  6/2015
(Continued)

OTHER PUBLICATIONS

Adouby, K., et al, "Structure and temperature transformation of SnSe. Stabilization of a new cubic phase Sn4Bi2Se7," Z. Kristallogr, 1998, vol. 213, pp. 343-349.
(Continued)

*Primary Examiner* — Andrew J. Oyer
(74) *Attorney, Agent, or Firm* — Birch, Stewart, Kolasch & Birch, LLP

(57) ABSTRACT

The present invention relates to a novel chalcogen-containing compound that exhibits excellent phase stability even at a temperature corresponding to the driving temperature of a thermoelectric element, and has a high output factor and thermoelectric figure of merit, a method for preparing the same, and a thermoelectric element including the same.

14 Claims, 11 Drawing Sheets

(56) References Cited

U.S. PATENT DOCUMENTS

| | | | |
|---|---|---|---|
| 2005/0076944 | A1 | 4/2005 | Kanatzidis et al. |
| 2010/0051080 | A1* | 3/2010 | Rhyee .................... C04B 35/65 |
| | | | 136/239 |
| 2010/0139730 | A1 | 6/2010 | Bentien et al. |
| 2012/0055526 | A1 | 3/2012 | Rhyee et al. |
| 2016/0099396 | A1 | 4/2016 | Lee et al. |
| 2019/0288172 | A1* | 9/2019 | Min ..................... C01B 19/002 |

FOREIGN PATENT DOCUMENTS

| | | |
|---|---|---|
| EP | 2 009 672 A1 | 12/2008 |
| JP | 2008-512001 A | 4/2008 |
| KR | 10-2012-0019701 A | 3/2012 |
| KR | 10-2014-0116668 A | 10/2014 |
| KR | 10-2017-0041540 A | 4/2017 |
| WO | WO 2018/080085 A1 | 5/2018 |

OTHER PUBLICATIONS

Chen, K.B., et al, "Synthesis and characterization of quaternary selenides Sn2Pb5Bi4Se13 and Sn8.65Pb0.35Bi4Se15," Solid State Sciences, 2009, vol. 11, pp. 1666-1672.

Guseinov, F.N., et al, "Phase Equilibria in the PbSe—Bi2Se3—Se System anti Thermodynamic Properties of Intermediate Phases," Russian Journal of Inorganic Chemistry, 2012, vol. 57, No. 1, pp. 100-103.

Abdul-Jabbar, N.M., et al, "Probing the local environment of two-dimensional ordered vacancy structures in Ga2SeTe2 via aberration-corrected election microscopy" Applied Physics Letters, Feb. 3, 2014, vol. 104, No. 5, pp. 051904-1 to 051904-3.

Chen, K.B., et al, "Synthesis and phase width of new quaternary selenides PbxSn6—xBi2Se9 (x=0-4.36)," Journal of Solid State Chemistry, Nov. 1, 2010, vol. 183, No. 11, pp. 2616-2622.

European Search Report for Appl. No. 18801598.7 dated Sep. 9, 2019.

Iordanidis, L., et al., "A2Bi8Se13 (A=Rb, Cs), CsBi3.67Se6, and BaBi2Se4: New Ternary Semiconducting Bismuth Selenides," Chem. Mater., Feb. 1, 2001, vol. 13, No. 2, pp. 622-633.

Mrotzek, A., et al., "Structure and Thermoelectric Properties of the New Quaternary Bismuth Selenides A1-xM4-xBi11+xSe21 (A=K and RB and Cs: M=Sn and Pb)—Members of the Grand Homologous Series Km(M6Se8)m(M5+nSe9+n)," Chem. Eur. J., May 31, 2011, vol. 7, No. 9, pp. 1915-1926.

Adouby et al., "X-ray diffraction, $^{119}$Sn Mössbauer and thermal study of SnSe—$Bi_2Se_3$ system", Journal of Alloys and Compounds 2008, vol. 453, pp. 161-166.

Chen, "Synthesis and Characterization of New Lillianite-type Quaternary Homologous Series of Selenides", A Thesis Submitted to Department of Applied Chemistry, College of Science, National Chiao Tung University, 1986, Total 128 pages.

Guéguen et al., "Thermoelectric Properties and Nanostructuring in the p-Type Materials $NaPb_{18-x}Sn_xMTe_{20}$ (M=Sb, Bi)", Chem. Mater. 2009, vol. 21, No. 8, pp. 1683-1694.

International Search Report (PCT/ISA/210) issued in PCT/KR2018/003181, dated Jul. 10, 2018.

Liang et al., "Evidence for massive bulk Dirac fermions in $Pb_{1-x}Sn_xSe$ from Nernst and thermopower experiments", Nature Communications 2013, vol. 4, pp. 2696-2714.

Olvera et al., "$Pb_7Bi_4Se_{13}$: A Lillianite Homologue with Promising Thermoelectric Properties", Inorganic Chemistry, 2015, vol. 54, pp. 746-755. See the entire document.

* cited by examiner

CHALCOGEN-CONTAINING COMPOUND, ITS PREPARATION METHOD AND THERMOELECTRIC ELEMENT COMPRISING THE SAME

CROSS-REFERENCE TO RELATED APPLICATION

This application claims the benefit of Korean Patent Application NO. 10-2017-0060148 filed on May 15, 2017 with the Korean Intellectual Property Office, the disclosure of which is herein incorporated by reference in its entirety.

TECHNICAL FIELD

The present invention relates to a chalcogen-containing compound that exhibits excellent phase stability even at a relatively low temperature, and has a high output factor and thermoelectric figure of merit, a method for preparing the same, and a thermoelectric element including the same.

BACKGROUND ART

Due to recent environmental problems caused by resource depletion and combustion, studies on thermoelectric conversion materials using waste heat are progressing as one of alternative energy sources.

The energy conversion efficiency of such thermoelectric conversion material depends on a thermoelectric figure of merit (ZT). Here, ZT is determined according to the Seebeck coefficient, electrical conductivity, thermal conductivity, etc., and more specifically, it is proportional to the square of the Seebeck coefficient and electrical conductivity, and is inversely proportional to thermal conductivity. Thus, in order to increase the energy conversion efficiency of a thermoelectric conversion element, the development of a thermoelectric conversion material having a high Seebeck coefficient or electrical conductivity or low thermal conductivity is required.

Among the various thermoelectric conversion materials known before, thermoelectric conversion materials with a crystal lattice structure related to or similar to sodium chloride (NaCl), in which a part of the lattice site is vacant, such as PbTe, $Bi_2Te_3$, SnSe, etc., for example, are known to exhibit an excellent thermoelectric conversion property. That is, it is considered that materials having such a crystal lattice structure exhibit excellent electrical conductivity due to the crystal lattice structure similar to sodium chloride, and exhibit low thermal conductivity because a part of the lattice site becomes vacant. Thus, thermoelectric conversion materials having the above-described crystal lattice structure are known to have an excellent thermoelectric conversion property, and thus are being applied.

Nevertheless, little is known about a thermoelectric conversion material that has face-centered cubic lattice structure identical to sodium chloride as shown in FIG. 1, in which a part of the lattice site is vacant.

However, $Sn_4Bi_2Se_7$, one of Sn—Bi—Se-based chalcogen compounds, is known to have an identical face-centered cubic lattice structure to that of sodium chloride, and includes a lattice site of which a part is vacant. For reference, FIG. 2 shows a phase stability diagram of representative Sn—Bi—Se-based chalcogen compounds, wherein $Sn_4Bi_2Se_7$ is known to have the face-centered cubic lattice structure at a temperature of about 580 to 720° C. (a part indicated by a circle in FIG. 2).

However, such chalcogen compounds maintain stability only at a temperature range of about 580 to 720° C., and at lower temperature, particularly at the driving temperature of a thermoelectric element, they cannot exhibit phase stability because they are decomposed to other phases. Consequently, although it is expected that the above-described chalcogen compound exhibits low thermal conductivity and an excellent thermoelectric property because it has a face-centered cubic lattice structure including a lattice site of which a part is vacant, it exhibits inferior phase stability at a low temperature of about 580° C. or less, corresponding to the general driving temperature of thermoelectric elements, and thus application as a thermoelectric conversion material is very limited.

SUMMARY OF INVENTION

Technical Problem

It is an object of the present invention to provide a novel chalcogen-containing compound that exhibits excellent phase stability even at a temperature corresponding to the driving temperature of a thermoelectric element, and has a high output factor and thermoelectric figure of merit, and a method for preparing the same.

It is another object of the present invention to provide a thermoelectric element including the chalcogen-containing compound.

Solution to Problem

The present invention provides a chalcogen-containing compound represented by the following Chemical Formula 1.

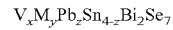   [Chemical Formula 1]

In Chemical Formula 1, V is a vacancy, M is an alkali metal, x, y, z, and, 4−z are mole ratios of V, M, Pb, and, Sn, respectively, x is greater than 0 and less than 1, y is greater than 0 and less than 1, x+y is greater than 0 and equal to or less than 1, z is greater than 0 and equal to or less than 4, and x+y+z is greater than 0 and equal to or less than 5.

The present invention also provides a method for preparing a chalcogen-containing compound, including the steps of: melting a mixture including raw materials of Sn, Pb, Bi, Se, and an alkali metal (M); heat treating the molten mixture; grinding the heat treated product; and sintering the ground product.

The present invention also provides a thermoelectric element including the above chalcogen-containing compound as a thermoelectric conversion material.

Hereinafter, a chalcogen-containing compound, a method for preparing the same, and a thermoelectric element including the same according to specific embodiments of the invention will be explained in detail.

According to one embodiment of the present invention, a chalcogen-containing compound represented by the following Chemical Formula 1 is provided.

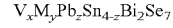   [Chemical Formula 1]

In Chemical Formula 1, V is a vacancy, M is an alkali metal, x, y, z, and, 4−z are mole ratios of V, M, Pb, and Sn, respectively, x is greater than 0 and less than 1, y is greater than 0 and less than 1, x+y is greater than 0 and equal to or less than 1, z is greater than 0 and equal to or less than 4, and x+y+z is greater than 0 and equal to or less than 5.

The chalcogen-containing compound of the one embodiment is a compound represented by Chemical Formula 1 in which an alkali metal and Pb are added to a chalcogen compound such $Sn_4Bi_2Se_7$ and a part of the lattice site is vacant, and it has the same crystal lattice structure as $Sn_4Bi_2Se_7$, that is, a crystal structure of a face-centered cubic lattice structure that is identical to that of sodium chloride.

More specifically, the compound of the one embodiment has a vacancy, which is a vacant site excluding the sites filled with Se, Sn, Pb, and Bi, in the face-centered cubic lattice structure, and the alkali metal fills at least a part of the vacancy.

Further, in the compound of the one embodiment, the Pb is substituted at a part of the site to be filled with the Sn, in the face centered cubic lattice structure.

As demonstrated in the examples described below, it was confirmed that the compound of the one embodiment can exhibit excellent electrical conductivity due to the crystal lattice structure of a face-centered cubic lattice structure and the addition of an alkali metal. This results from the crystal lattice structure, and simultaneously, is because the alkali metal becomes in the form of ions, thus donating additional electrons.

Further, the compound of the one embodiment has the above-described specific crystal structure, but the alkali metal does not completely fill the vacant lattice site, i.e., a vacancy, and a part of the vacant lattice site remains. The vacancy is a state wherein an atom of a lattice point is left out in a specific crystal lattice structure, and it facilitates the diffusion of atoms, and thus the existence of a vacancy may have an important influence on heat treatment, deformation, precipitation, phase transition, etc. Since the compound of the one embodiment has a face-centered cubic lattice structure but a part of a vacancy remains, it exhibits low thermal conductivity and the resulting excellent thermoelectric conversion property.

Meanwhile, as demonstrated in the examples described below, the vacancy performs a very important function for the formation of a face-centered cubic lattice structure identical to sodium chloride, and if the vacancy is completely filled with an alkali metal, Pb, Sn, or Bi and removed as Comparative Examples 2 to 4, besides the face-centered cubic lattice structure, secondary phases with different structures are formed together, thus deteriorating the properties such as electrical conductivity, and thus the application as a thermoelectric conversion material is very limited.

Moreover, it was confirmed that since the chalcogen-containing compound of the one embodiment has an alkali metal added in the crystal lattice structure, it exhibits excellent phase stability even at a low temperature (for example, a temperature of about 580° C. or more) corresponding to the driving temperature of a thermoelectric element. Such excellent phase stability can be confirmed by the maintenance of an identical XRD pattern and an identical crystal structure without decomposition of the compound, even when the chalcogen-containing compound of the one embodiment is finally prepared and left in the form of a sintered body.

Furthermore, it was confirmed that since Pb is substituted at a part of the Sn site in the face-centered cubic lattice structure of the compound of the one embodiment, the output factor and thermal figure of merit (ZT) can be remarkably improved. Since Pb has a larger atomic radius than Sn, as the substitution amount of Pb increases, the lattice structure is properly filled and a lattice constant increases, and due to such change in the crystal structure and electron structure, as the content of Pb substituted at the Sn site increases, the electrical conductivity and Seebeck coefficient increase. Further, as the content of Pb substituted at the Sn site increases, the lattice thermal conductivity decreases due to phonon scattering, and thus total thermal conductivity decreases. Particularly, since the electrical conductivity and Seebeck coefficient have an influence on an output factor, and electrical conductivity, the Seebeck coefficient and thermal conductivity coefficient have an influence on the thermoelectric figure of merit (ZT), as the content of Pb substituted at the Sn site increases, the electrical conductivity and Seebeck coefficient increase and the thermal conductivity decreases, thus exhibiting an excellent output factor and thermoelectric figure of merit (ZT).

Thus, the chalcogen-containing compound of one embodiment overcomes the problems of previously known $Sn_4Bi_2Se_7$, etc. in terms of inferior phase stability, and exhibits excellent phase stability even at the general driving temperature of a thermoelectric element, and simultaneously, exhibits excellent electrical conductivity and low thermal conductivity due to the unique crystal lattice structure, and exhibits remarkably excellent output factor and thermoelectric figure of merit (ZT). Thus, the chalcogen-containing compound of one embodiment can be very preferably used as a thermoelectric conversion material in various fields and applications.

Meanwhile, as explained above, in the face-centered cubic lattice structure of the chalcogen-containing compound of one embodiment, at least a part of the vacancy excluding the sites filled with Se, Pb, Sn, and Bi is filled with the alkali metal atom. More specifically, in such a face-centered cubic lattice structure, the Se fills the anion sites of the face-centered cubic lattice structure, the Sn, Pb, and Bi fill the cation sites of the face-centered cubic lattice structure, the vacancy (V) is a vacant site of the remaining cation site excluding the sites filled with Sn, Pb, and Bi, and the alkali metal (M) fills at least a part of the vacancy.

Herein, the alkali metal, and Sn, Pb, and Bi that fill each cation site become cations, and can donate electrons, thus contributing to the excellent electrical conductivity of the compound of one embodiment. In addition, since the addition of the alkali metal may contribute to excellent phase stability, and the alkali metal cannot completely fill the vacant lattice site and a vacancy remains, the chalcogen-containing compound of one embodiment may exhibit low thermal conductivity.

Moreover, since the electrical conductivity and Seebeck coefficient increase and thermal conductivity decreases by the substitution of a part of the Sn site with Pb, remarkably excellent output factor and thermoelectric figure of merit (ZT) may be exhibited.

As the alkali metal, one or more alkali metals selected from the group consisting of Li, Na, and K may be used, but considering high electrical conductivity and excellent phase stability of the compound of one embodiment, Na may be appropriately used.

In Chemical Formula 1, x, y, z, and 4−z represent the mole ratios of vacancy V, alkali metal M, Pb, Sn, respectively, wherein x may be greater than 0 and less than 1, y may be greater than 0 and less than 1, x+y may be greater than 0 and equal to or less than 1, z may be greater than 0 and equal to or less than 4, and x+y+z may be greater than 0 and equal to or less than 5. According to a more specific embodiment, x may be 0.05 to 0.9, 0.3 to 0.8, or 0.6 to 0.8, y may be 0.05 to 0.8, 0.1 to 0.6, or 0.15 to 0.2, and x+y may be 0.1 to 1, 0.4 to 1, or 0.7 to 1. Further, z may be 0.01 to 3.5, 0.03 to 3, or 0.05 to 1, and x+y+z may be 0.11 to 4.5, 0.5 to 4, or 0.8 to 2.

By fulfilling each mole ratio, the compound of one embodiment can exhibit excellent phase stability due to the addition of an alkali metal, and exhibit low thermal conductivity due to the vacancy, while maintaining the unique crystal lattice structure. Also, since the mole ratios of the alkali metal, Bi, etc. that donate electrons are optimized, the compound of one embodiment can exhibit excellent electrical conductivity. Furthermore, since the electrical conductivity and Seebeck coefficient increase and thermal conductivity decreases by the substitution of a part of the Sn site with Pb, a remarkably excellent output factor and thermoelectric figure of merit (ZT) may be exhibited.

Since the chalcogen-containing compound of the above-explained one embodiment has an excellent thermoelectric conversion property and high phase stability due to low thermal conductivity, high electrical conductivity, a high output factor, and a high thermoelectric figure of merit (ZT), it can be preferably used as a thermoelectric conversion material in various thermoelectric cooling systems, thermoelectric generation systems, etc.

Meanwhile, according to another embodiment of the present invention, a method for preparing the above-explained chalcogen-containing compound is provided. The preparation method includes the steps of: melting a mixture including raw materials of Sn, Pb, Bi, Se, and an alkali metal (M); heat treating the molten mixture; grinding the heat treated product; and sintering the ground product.

In the preparation method, as the raw materials including Sn, Pb, Bi, Se, and an alkali metal (M), for example, shot (particle without a sharp angle) and/or powder of Sn, Pb, Bi, Se, and an alkali metal may be used. As the raw material including an alkali metal, particularly, a powder of $M_2Se$ (M is an alkali metal) may be used, but is not limited thereto.

The raw material including an alkali metal (M), Pb, Bi, Se, and Sn are weighed at rates corresponding to the mole ratios of Chemical Formula 1 (y, z, 4−z, 2, 7), mixed and charged into a quartz tube, and then, the mixture is melted. For example, the mixture may be melted to a temperature of about 750 to 900° C. in a quartz tube in a vacuum and sealed state. Here, in order to prevent reaction between the raw materials and quartz tube, the mixture may be first put in a carbon crucible and then charged into the quartz tube.

The formation of the mixture of raw materials may be performed by adding each raw material at predetermined rates, then grinding or milling, and selectively pelletizing. The formed mixture may be in the state of a powder, pellet, ingot, etc. according to the process.

After the mixture is melted, the molten mixture may be heat treated, for example, at a temperature of 500 to 650° C. for 24 to 72 hours. Such a heat treatment may be performed in a furnace such as an electric furnace, etc., and it may be performed under a vacuum or inert gas atmosphere. The heat treatment may be performed in a single step, or it may be divided into two or more steps and performed.

After the heat treatment, the heat treated product is ground. Such a grinding step may be performed using a previously known method and apparatus for preparing a thermoelectric conversion material, and through the grinding step, a powder product may be obtained.

Meanwhile, between the heat treatment step and the grinding step, a step of cooling the product of the heat treatment step to form an ingot may be further performed. Here, the cooling may be performed using various cooling media, and any cooling devices and methods previously used in the preparation process of a thermoelectric conversion material may be used without specific limitations. After forming an ingot through the cooling step, the ingot may be ground.

After the grinding step, the ground product may be sintered. By performing the sintering step, a chalcogen-containing compound in the form of a sintered body may be prepared.

Such a sintering step may be performed by spark plasma sintering, etc. that are well known to a person having ordinary knowledge, and for example, it may be performed at a temperature of 550 to 700° C. and a pressure of 10 to 130 MPa. According to a more specific embodiment, the sintering step may be performed at a temperature of 550 to 640° C. and a pressure of 10 to 100 MPa for 5 to 10 minutes.

After performing the sintering, a cooling step may be further performed.

Since the above-explained steps may be performed by applying common preparation conditions, methods, and apparatuses for forming a metal compound such as a chalcogen compound or thermoelectric conversion material, and specific reaction conditions and methods are described in the examples below, additional explanations thereof are omitted.

According to yet another embodiment of the present invention, a thermoelectric element including the chalcogen-containing compound of the above embodiment as a thermoelectric conversion material is provided. Such a thermoelectric element may include the chalcogen-containing compound of the above embodiment (thermoelectric conversion material) as a p-type or n-type thermoelectric conversion material, and for this, it may include a compound additionally doped with an additional p-type or n-type element as a thermoelectric conversion material. The kind of the p-type element or n-type element or doping method that can be used is not specifically limited, and elements and doping methods commonly used to apply a thermoelectric conversion material as a p-type or n-type before may be used.

The thermoelectric element may include a thermoelectric element formed by processing and molding a p-type or n-type thermoelectric conversion material obtained in the form of a sintered body, and it may include an insulation substrate and electrode For the combination structure of the thermoelectric element, insulation substrate, and electrode, the structure of a common thermoelectric element may be applied.

As the insulation substrate, a sapphire substrate, a silicon substrate, a Pyrex substrate, a quartz substrate, etc. may be used, and as the electrode, any electrodes including metals or conductive metal compounds may be used.

Since the above-explained thermoelectric element includes the thermoelectric conversion material of one embodiment, it may exhibit an excellent thermoelectric conversion property, and may be preferably applied as a thermoelectric cooling system, thermoelectric generation system, etc. in various fields and uses.

Advantageous Effects of Invention

According to the present invention, a chalcogen-containing compound that exhibits excellent phase stability even at a temperature corresponding to the driving temperature of a thermoelectric element, and has a high output factor and thermoelectric figure of merit, may be provided. By applying such a chalcogen-containing compound, a thermoelectric element exhibiting excellent properties may be provided.

DESCRIPTION OF EMBODIMENTS

Figure 1:
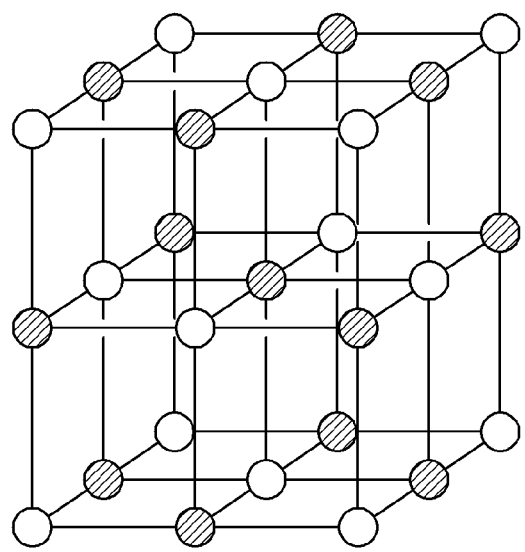
FIG. 1 is a schematic diagram showing the face-centered cubic lattice structure that is exhibited by sodium chloride, etc.
Figure 2:
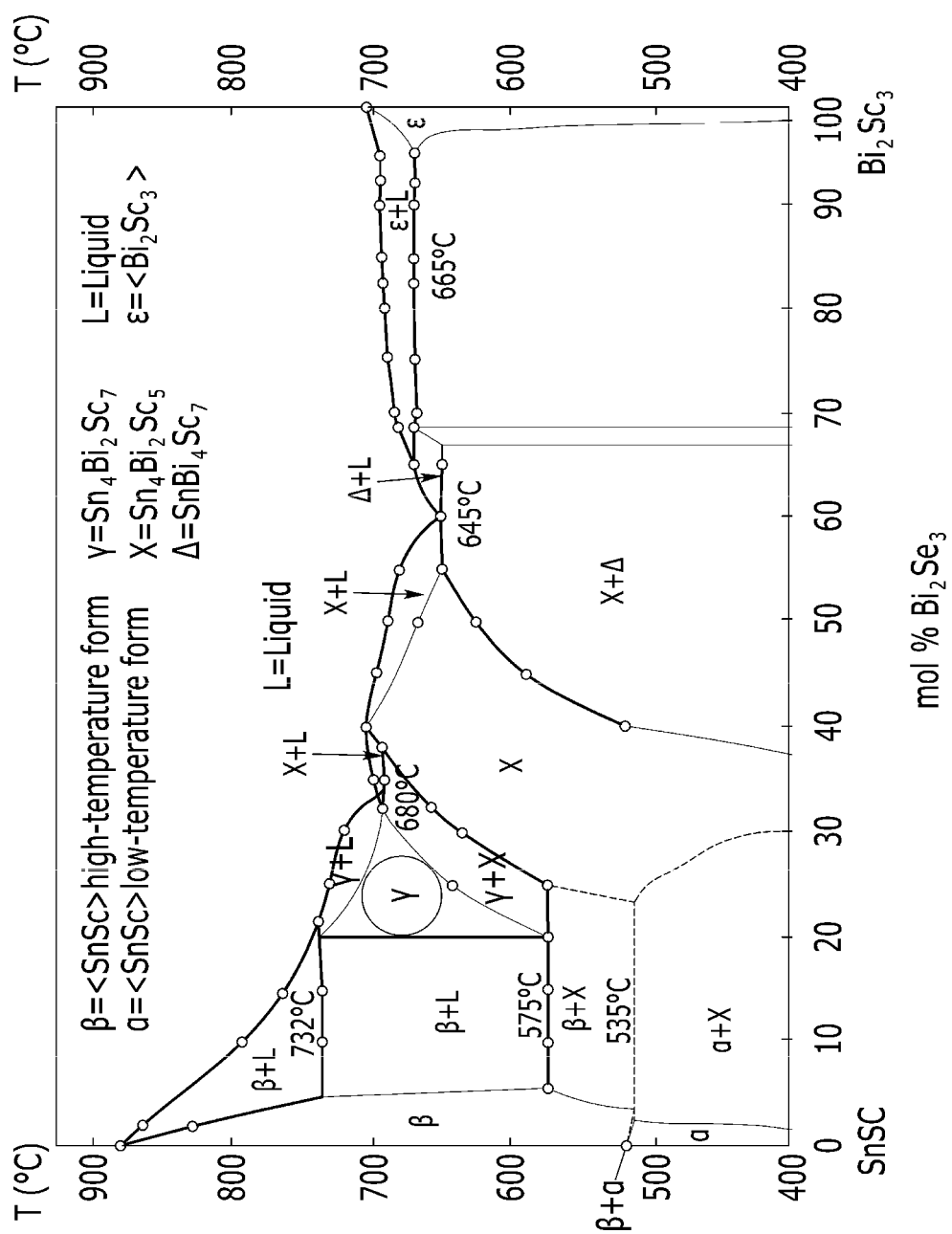
FIG. 2 is a phase stability diagram of representative Sn—Bi—Se-based chalcogen compounds.

The present invention will be explained in more detail in the following examples. However, these examples are presented only as illustrations of the present invention, and the scope of the present invention is not limited thereby.

Example 1: Preparation of a Chalcogen-Containing Compound ($V_{0.8}Na_{0.2}Pb_{0.05}Sn_{3.95}Bi_2Se_7$)

Each powder of high purity raw materials of Na, Pb, Sn, Bi, and Se was weighed in a glove box at a mole ratio of 0.2:0.05:3.95:2:7, put in a carbon crucible, and then charged into a quartz tube. The inside of the quartz tube was evacuated and sealed. The raw materials were maintained at a constant temperature in an electric furnace at 750° C. for 24 hours, and then slowly cooled at room temperature.

Thereafter, they were heat treated at 640° C. for 48 hours, the quartz tube in which a reaction was performed was cooled with water to obtain an ingot, the ingot was finely ground to powder with a particle diameter of 75 μm or less, and sintered by spark plasma sintering (SPS) at a temperature of 620° C. and a pressure of 50 MPa for 10 minutes, thus preparing a chalcogen-containing compound of $V_{0.8}Na_{0.2}Pb_{0.05}Sn_{3.95}Bi_2Se_7$.

Example 2: Preparation of a Chalcogen-Containing Compound ($V_{0.8}Na_{0.2}Pb_{0.1}Sn_{3.9}Bi_2Se_7$)

A chalcogen-containing compound of $V_{0.8}Na_{0.2}Pb_{0.1}Sn_{3.9}Bi_2Se_7$ was prepared by the same method as Example 1, except that each powder of high purity raw materials of Na, Pb, Sn, Bi, and Se was weighed in a glove box at a mole ratio of 0.2:0.1:3.9:2:7.

Example 3: Preparation of a Chalcogen-Containing Compound ($V_{0.8}Na_{0.2}Pb_{0.2}Sn_{3.8}Bi_2Se_7$)

A chalcogen-containing compound of $V_{0.8}Na_{0.2}Pb_{0.2}Sn_{3.8}Bi_2Se_7$ was prepared by the same method as Example 1, except that each powder of high purity raw materials of Na, Pb, Sn, Bi, and Se was weighed in a glove box at a mole ratio of 0.2:0.2:3.8:2:7.

Example 4: Preparation of a Chalcogen-Containing Compound ($V_{0.8}Na_{0.2}Pb_{0.4}Sn_{3.6}Bi_2Se_7$)

A chalcogen-containing compound of $V_{0.8}Na_{0.2}Pb_{0.4}Sn_{3.6}Bi_2Se_7$ was prepared by the same method as Example 1, except that each powder of high purity raw materials of Na, Pb, Sn, Bi, and Se was weighed in a glove box at a mole ratio of 0.2:0.4:3.6:2:7.

Example 5: Preparation of a Chalcogen-Containing Compound ($V_{0.8}Na_{0.2}Pb_{0.8}Sn_{3.2}Bi_2Se_7$)

A chalcogen-containing compound of $V_{0.8}Na_{0.2}Pb_{0.8}Sn_{3.2}Bi_2Se_7$ was prepared by the same method as Example 1, except that each powder of high purity raw materials of Na, Pb, Sn, Bi, and Se was weighed in a glove box at a mole ratio of 0.2:0.8:3.2:2:7.

Comparative Example 1: Preparation of a Chalcogen-Containing Compound ($V_{0.8}Na_{0.2}Sn_4Bi_2Se_7$)

A chalcogen-containing compound of $V_{0.8}Na_{0.2}Sn_4Bi_2Se_7$ was prepared by the same method as Example 1, except that each powder of high purity raw materials of Na, Pb, Sn, Bi, and Se was weighed in a glove box at a mole ratio of 0.2:4:2:7.

Comparative Example 2: Preparation of a Chalcogen-Containing Compound ($NaPb_{0.05}Sn_{3.95}Bi_2Se_7$)

A chalcogen-containing compound was intended to be prepared by the same method as Example 1, except that each powders of high purity raw materials of Na, Pb, Sn, Bi, and Se was weighed in a glove box at a mole ratio of 1:0.05:3.95:2:7.

Comparative Example 3: Preparation of a Chalcogen-Containing Compound ($Na_{0.2}Pb_{0.05}Sn_{4.75}Bi_2Se_7$)

A chalcogen-containing compound was intended to be prepared by the same method as Example 1, except that each powder of high purity raw materials of Na, Pb, Sn, Bi, and Se was weighed in a glove box at a mole ratio of 0.2:0.05:4.75:2:7.

Comparative Example 4: Preparation of a Chalcogen-Containing Compound ($Na_{0.2}Pb_{0.05}Sn_{3.95}Bi_{2.8}Se_7$)

A chalcogen-containing compound was intended to be prepared by the same method as Example 1, except that each powder of high purity raw materials of Na, Pb, Sn, Bi, and Se was weighed in a glove box at a mole ratio of 0.2:0.05:3.95:2.8:7.

Experimental Examples

1. Phase Analysis According to XRD Pattern

Figure 3:
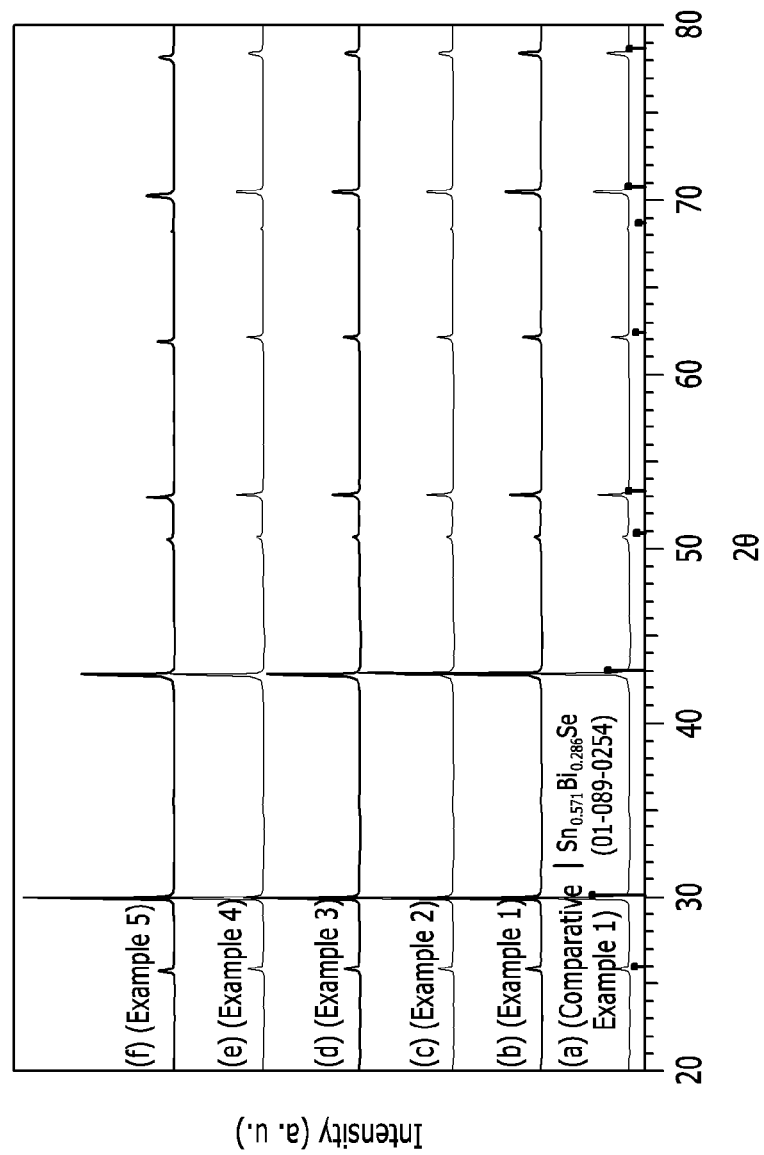
FIG. 3 is a graph showing X-ray diffraction analysis results of a chalcogen compound powder immediately before passing through a sintering process in Examples 1 to 5 and Comparative Example 1.
Figure 4:
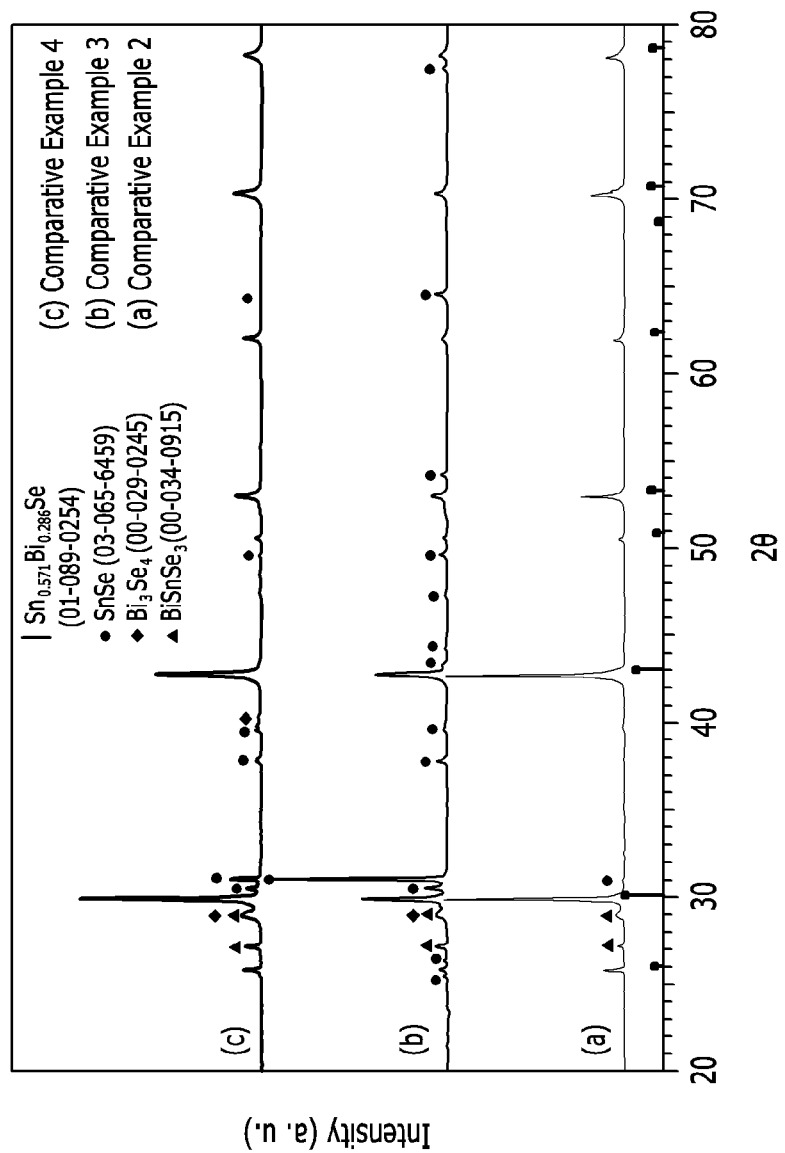
FIG. 4 is a graph showing X-ray diffraction analysis results of a chalcogen compound powder immediately before passing through a sintering process in Comparative Examples 2 to 4.

For the powder chalcogen-containing compounds immediately before the sintering process in Examples 1 to 5 and Comparative Example 1, X-ray diffraction analysis was performed and the results are shown in FIG. 3. In the same manner, for the powder chalcogen-containing compounds immediately before the sintering process in Comparative Examples 2 to 4, X-ray diffraction analysis was performed and the results are shown in FIG. 4. The sintered bodies finally prepared through the sintering processes in Examples 1 to 5 and Comparative Example 1 were slowly cooled from about 620° C. to 300° C., and then cooled again to room temperature (25° C.), and the sintered bodies were maintained under an air atmosphere for 15 days, and then each sintered body was subjected to X-ray diffraction analysis, and the results are shown in FIG. 5.

First, referring to FIG. 3, it was confirmed that the compounds of Examples 1 to 5 and Comparative Example 1 have crystal lattice structures identical to $Sn_4Bi_2Se_7$, which was previously known to have a face-centered cubic lattice structure at a high temperature, and thus it was confirmed that all the compounds of Examples 1 to 5 and Comparative Example 1 have a crystal lattice structure of a face-centered cubic lattice structure.

However, referring to FIG. 4, it was confirmed that Comparative Examples 2 to 4 include various secondary phases such as SnSe, $Bi_3Se_4$, $BiSnSe_3$, etc., in addition to the material having the same crystal structure as $Sn_4Bi_2Se_7$. Specifically, since the vacancy is completely filled with Na in Comparative Example 2, the vacancy is completely filled with Sn in Comparative Example 3, and the vacancy is completely filled with Bi in Comparative Example 4, in Comparative Examples 2 to 4, the vacancy is completely filled, and a single phase of face-centered cubic lattice structure cannot be formed due to the increase in the content of Na, Sn, or Bi. Thus, it was confirmed that the relations wherein the mole ratio (x) of the vacancy represented in Chemical Formula 1 is greater than 0 and less than 1, the mole ratio (y) of Na is less than 1, the mole ratio of the sum of Sn and Pb is equal to or less than 4, and the mole ratio of Bi is equal to or less than 2 should be fulfilled, so that a chalcogen-containing compound of a single phase of face-centered cubic lattice structure including a vacancy may be formed.

Figure 5:
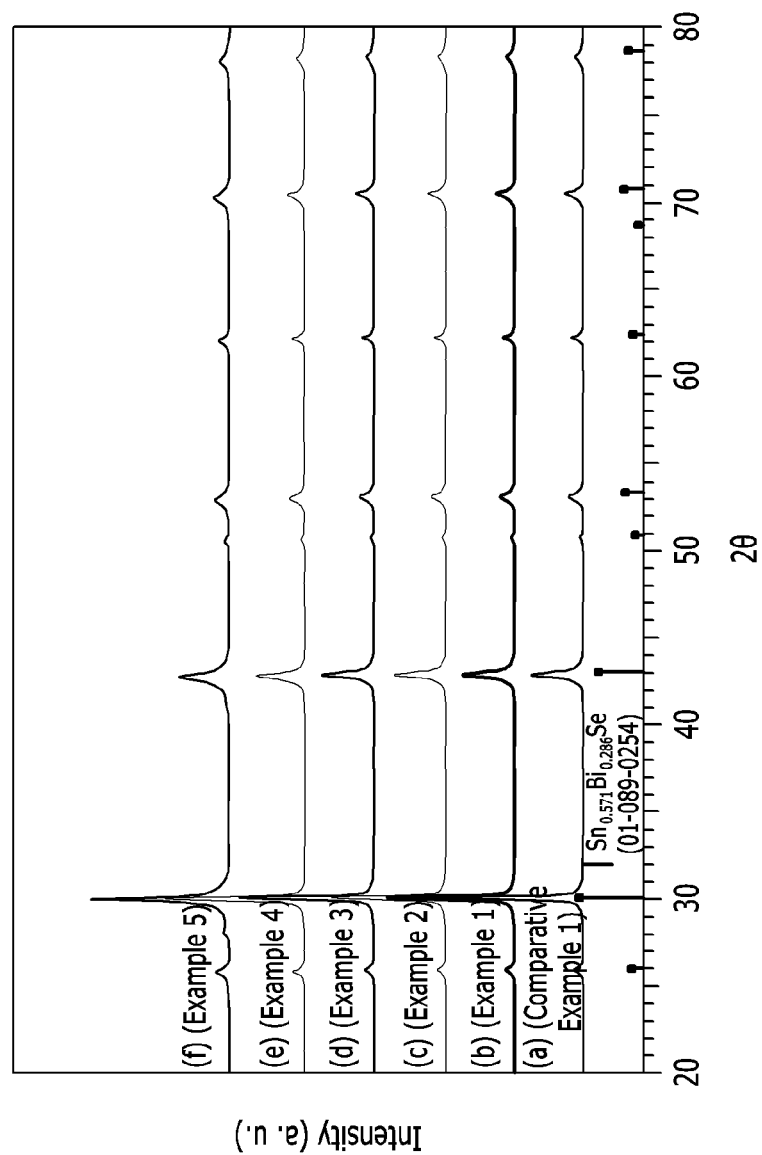
FIG. 5 is a graph showing X-ray diffraction analysis results of the sintered bodies finally prepared through a sintering process, after slow cooling and leaving at room temperature, in Examples 1 to 5 and Comparative Example 1.

Furthermore, referring to FIG. 5, it was confirmed that the compounds of Examples 1 to 5 and Comparative Example 1, when left at a relatively low temperature, maintain face-centered cubic lattice structures without generation of secondary phases, and exhibit excellent phase stability. Thus, it was confirmed that the compounds of Examples 1 to 5 and Comparative Example 1 exhibit excellent phase stability even at a relatively low temperature.

2. Results Using TOPAS Program

Using the TOPAS program, the lattice parameter of each powder chalcogen-containing compound of Examples 1 to 5 and Comparative Example 1 was calculated and is shown in the following Table 1. Further, the Rietveld refinement results of the chalcogen-containing compounds of Examples 1 to 5 and Comparative Example 1, calculated through the TOPAS program, are shown in the following Table 2.

TABLE 1

| Powder material | Lattice parameter (Å) |
|---|---|
| Example 1 | 5.9648 |
| Example 2 | 5.9671 |
| Example 3 | 5.9681 |
| Example 4 | 5.9724 |
| Example 5 | 5.9817 |
| Comparative Example 1 | 5.9646 |

TABLE 2

| Unit (wt %) | Example 1 | Example 2 | Example 3 | Example 4 | Example 5 | Comparative Example 1 |
|---|---|---|---|---|---|---|
| acancy (0, 0, 0) occupancy | 0.1157 | 0.1161 | 0.1156 | 0.1166 | 0.1157 | 0.1171 |
| Na (0, 0, 0) occupancy | 0.0286 | 0.0286 | 0.0286 | 0.0286 | 0.0286 | 0.0286 |
| Sn (0, 0, 0) occupancy | 0.5643 | 0.5567 | 0.5428 | 0.5134 | 0.4571 | 0.57 |
| Bi (0, 0, 0) occupancy | 0.2843 | 0.2843 | 0.2843 | 0.2843 | 0.2843 | 0.2843 |
| Pb (0, 0, 0) occupancy | 0.0071 | 0.0143 | 0.0287 | 0.0571 | 0.1143 | — |
| Se (0.5, 0.5, 0.5) occupancy | 1 | 1 | 1 | 1 | 1 | 1 |
| Rwp (weighted pattern R) | 5.39 | 6.24 | 5.997 | 6.31 | 6.99 | 5.37 |

Referring to Table 1, it was confirmed that as the content of Pb substituted at the Sn site increases in the face-centered cubic lattice structure, a lattice parameter gradually increases. That is, it was confirmed that a lattice parameter is in the order of Example 5>Example 4>Example 3>Example 2>Example 1>Comparative Example 1. Thus, it was confirmed that since Pb has a larger atomic radius than Sn, as the amount of Pb substitution increases, a lattice structure is fully filled and thus a lattice parameter increases.

Meanwhile, referring to Table 2, it was confirmed that in the case of Examples 1 to 5 and Comparative Example 1 exhibiting single phases, vacancy, Na, Sn, Pb, and Bi are randomly distributed at an (x, y, z)=(0, 0, 0) site, and Se is located at an (x, y, z)=(0.5, 0.5, 0.5) site. It was also confirmed that each composition included in the chalcogen-containing compound is very similar to the composition of each powder of high purity raw materials of Na, Pb, Sn, Bi, and Se.

3. Temperature Dependency of Electrical Conductivity

Figure 6:
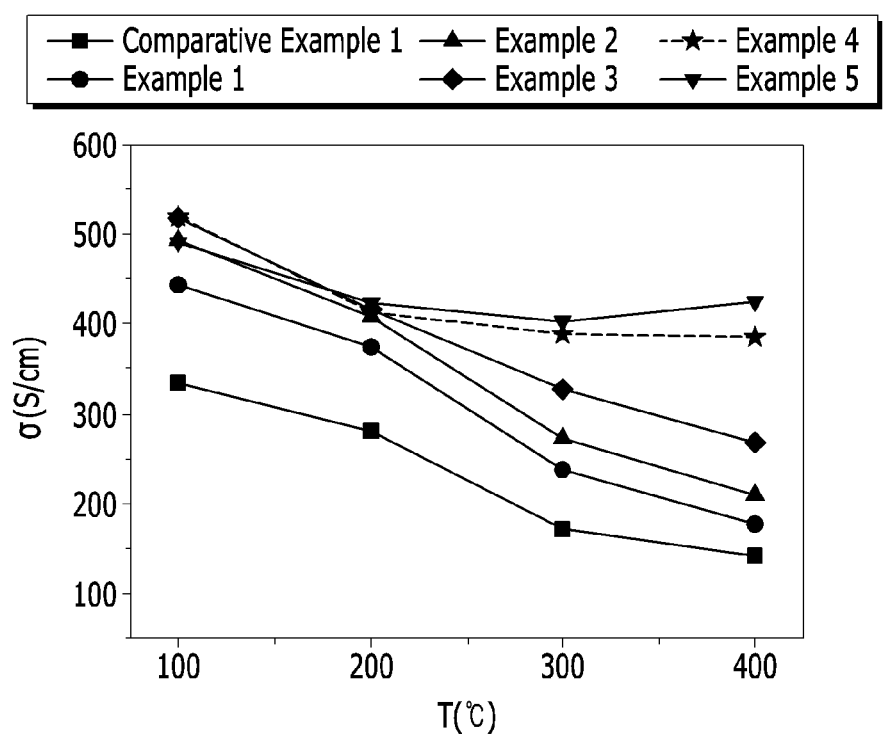
FIG. 6 is a graph showing results of measuring electrical conductivities of chalcogen compounds of Examples 1 to 5 and Comparative Example 1 according to temperature.

For the chalcogen-containing compound specimens prepared in Examples 1 to 5 and Comparative Example 1, electrical conductivities were measured according to temperature change and are shown in FIG. 6. The electrical conductivity was measured at a temperature range of 100 to 400° C. through a four-probe direct current method, using a resistivity meter of LSR-3 from Linseis Inc.

Referring to FIG. 6, it was confirmed that Examples 1 to 5 exhibit higher electrical conductivities than Comparative Example 1. Particularly, it was confirmed that electrical conductivities is in the order of Example 5>Example 4>Example 3>Example 2>Example 1, and thus it was confirmed that as the content of Pb increases, electrical conductivity gradually increases. It was also confirmed that as a temperature increases, a tendency of an electrical conductivity increase is higher. It was confirmed that as the content of Pb substituted at the Sn site increases, a change in the electronic structure of the chalcogen compound is caused, and due to such a change in the electronic structure, electrical conductivity increases.

Figure 7:
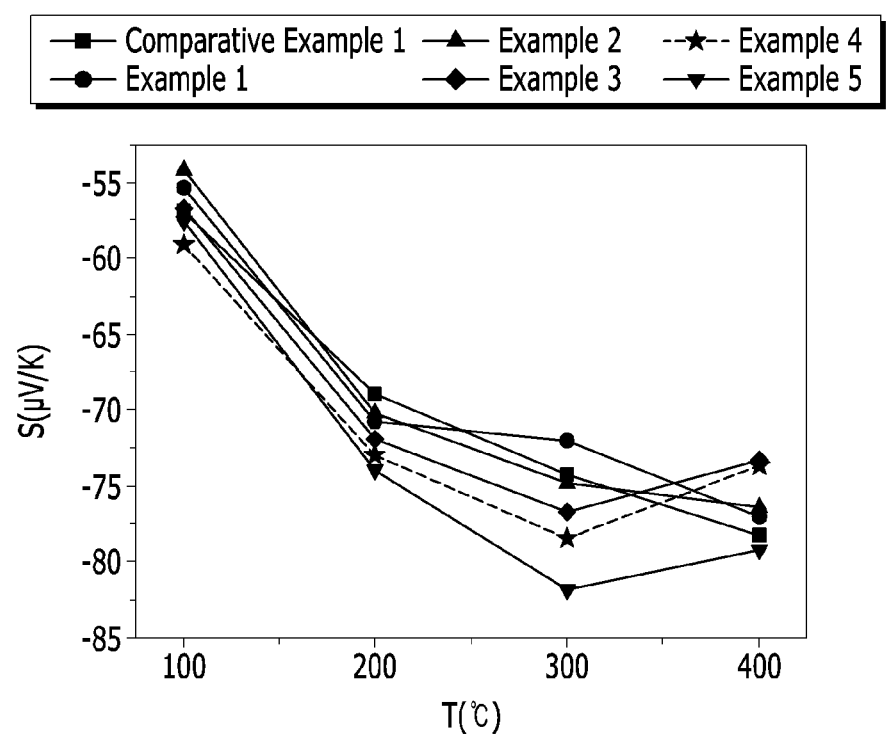
FIG. 7 is a graph showing results of measuring Seebeck coefficients of the chalcogen compounds of Examples 1 to 5 and Comparative Example 1 according to temperature.

4. Measurement of Seebeck Coefficient and Temperature Dependency of Seebeck Coefficient For the chalcogen-containing compound specimens prepared in Examples 1 to 5 and Comparative Example 1, Seebeck coefficients (S) were measured according to temperature change and are shown in FIG. 7. The Seebeck coefficient was measured at a temperature range of 100 to 400° C. by differential voltage/temperature technique, using measuring equipment of LSR-3 from Linseis Inc.

As shown in FIG. 7, it was confirmed that Examples 1 to 5 and Comparative Example 1 exhibit minus (−) Seebeck coefficients, and thus the major electric charge carriers of the materials are electrons, thus exhibiting the properties as an N-type semiconductor material.

Meanwhile, it was confirmed that, although Examples 1 to 5 have higher electrical conductivities as explained above, Examples 1 to 5 generally have higher Seebeck coefficients than Comparative Example 1. Particularly, it was confirmed that as the content of Pb increases, the Seebeck coefficient tends to increase, and thus it was confirmed that as the content of Pb substituted at the Sn site increase, both electrical conductivity and Seebeck coefficient become high, and thus the electrical properties of material are excellent.

5. Temperature Dependency of Output Factor

Figure 8:
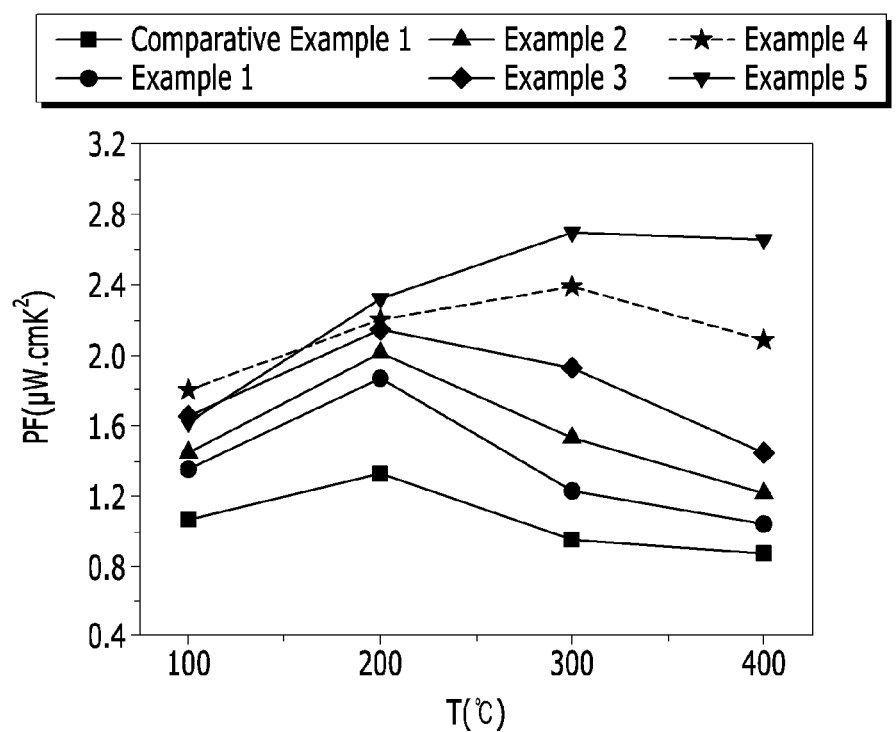
FIG. 8 is a graph showing results of measuring output factors of the chalcogen compounds of Examples 1 to 5 and Comparative Example 1 according to temperature.

For the chalcogen-containing compound specimens prepared in Examples 1 to 5 and Comparative Example 1, output factors were calculated according to temperature change and are shown in FIG. 8.

The output factor is defined as power factor (PF)=$\sigma S^2$, and it was calculated using the values of $\sigma$ (electrical conductivity) and S (Seebeck coefficient) shown in FIGS. 6 and 7.

As shown in FIG. 8, it was confirmed that Examples 1 to 5 exhibit excellent output factors compared to Comparative Example 1, and that as the content of Pb substituted at the Sn site increases, the output factor increases. Particularly, the output factor of Example 5 measured at 400° C. was about 2.8 $\mu W/cmK^2$, exhibiting a 206% increase rate compared to Comparative Example 1.

Figure 9:
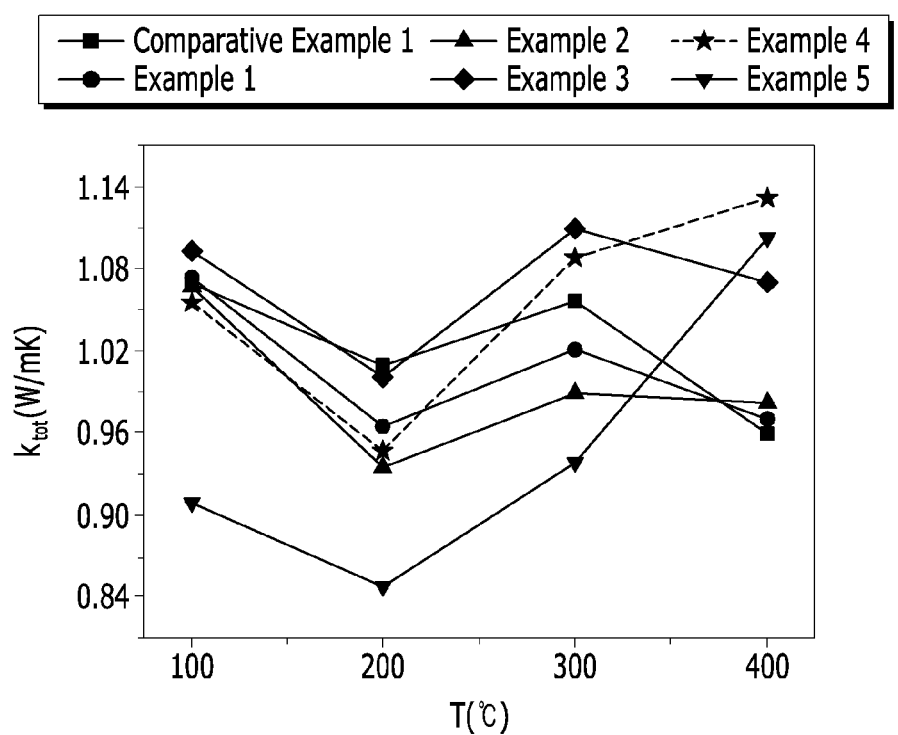
FIG. 9 is a graph showing results of measuring total thermal conductivities of the chalcogen compounds of Examples 1 to 5 and Comparative Example 1 according to temperature.
Figure 10:
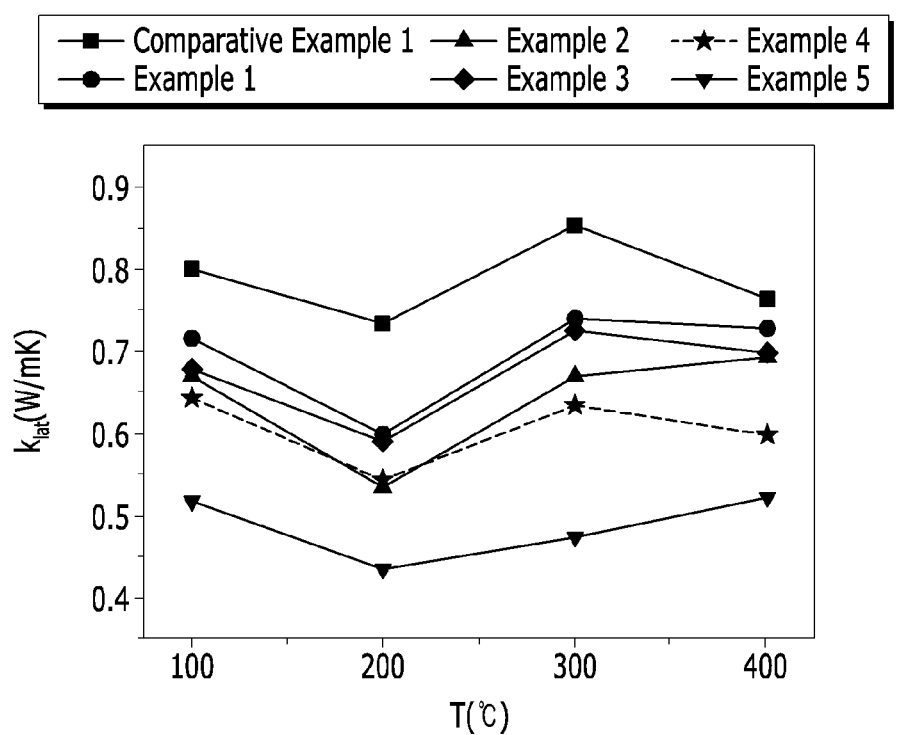
FIG. 10 is a graph showing results of calculating lattice thermal conductivities of the chalcogen compounds of Examples 1 to 5 and Comparative Example 1 according to temperature.

6. Temperature Dependency of Total Thermal Conductivity and Lattice Thermal Conductivity For the chalcogen-containing compound specimens prepared in Examples 1 to 5 and Comparative Example 1, total thermal conductivities and lattice thermal conductivities were measured according to temperature change and are shown in FIG. 9 and FIG. 10, respectively. For the measurement of thermal conductivity, first, thermal diffusivity (D) and heat capacity ($C_p$) were measured by a laser flash method, using thermal conductivity measuring equipment of LFA457 from Netzsch Company. The measured values were applied in the equation "thermal conductivity (k)=D$\rho C_p$ ($\rho$ is the density of a sample measured by Archimedes' principle)".

Further, total thermal conductivity (k=$k_L$+$k_E$) is divided into lattice thermal conductivity ($k_L$) and thermal conductivity ($k_E$) calculated according to Wiedemann-Franz law ($k_E$=L$\sigma$T), wherein, as the Lorentz number (L), a value calculated from the Seebeck coefficient according to temperature was used.

Referring to FIGS. 9 and 10, it was confirmed that Examples 1 to 5 generally exhibit low total thermal conductivities, and particularly, in the case of lattice thermal conductivity, all of Examples 1 to 5 exhibit low values compared to Comparative Example 1.

The chalcogen-containing compounds of Examples 1, 2, 4, and 5, although having higher $k_E$ values, exhibit lower total thermal conductivities than Comparative Example 1, due to high electrical conductivity. Particularly, Example 5 exhibits the lowest total thermal conductivity, because the lattice thermal conductivity of Example 5 is relatively the lowest value, as shown in FIG. 10. As the content of Pb substituted at the Sn site increases, the lattice thermal conductivity more decreases due to phonon scattering, and particularly, the lattice thermal conductivity of Example 5 at 200° C. is as low as 0.45 W/mK.

7. Temperature Dependency of Thermoelectric Figure of Merit (ZT)

Figure 11:
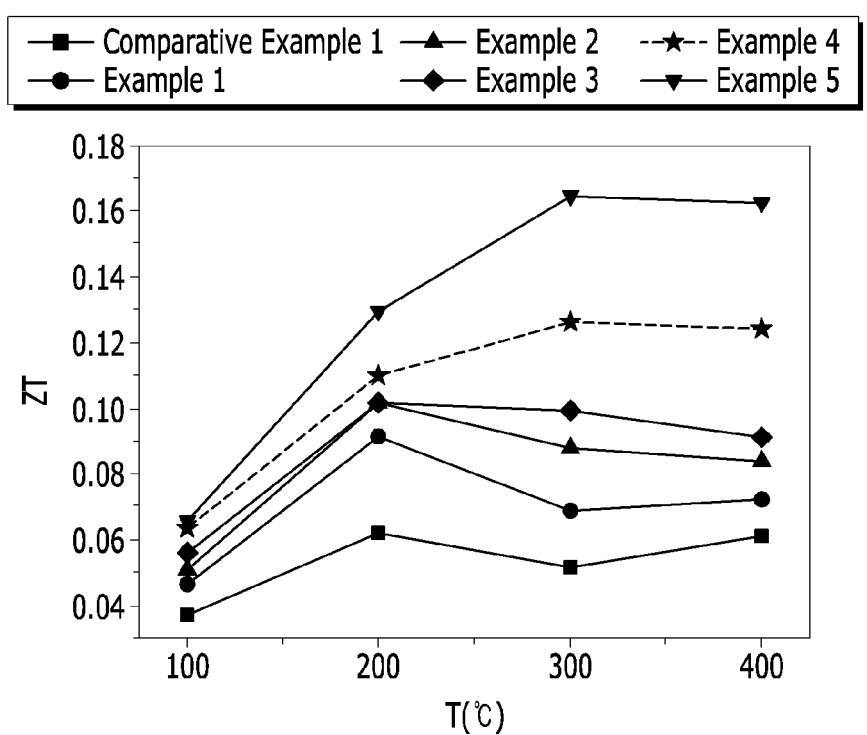
FIG. 11 is a graph showing results of calculating thermoelectric figures of merit of the chalcogen compounds of Examples 1 to 5 and Comparative Example 1 according to temperature.

For the chalcogen-containing compound specimens prepared in Examples 1 to 5 and Comparative Example 1, the thermoelectric figures of merit were calculated according to temperature change and are shown in FIG. 11. The thermoelectric figure of merit is defined as ZT=$S^2\sigma T/k$, and it was calculated using the S (Seebeck coefficient), G (electrical conductivity), T (absolute temperature), and k (thermal conductivity) values obtained in experimental examples.

Referring to FIG. 11, it was confirmed that Examples 1 to 5 exhibit excellent thermoelectric figures of merit that can be applied as a thermoelectric conversion material. Particularly, as the content of Pb substituted at the Sn site increased, the ZT value increased, and the ZT value of Example 5 at 400° C. showed an increase rate of about 133% compared to the ZT value of Comparative Example 1 at the same temperature, and the average ZT value of Example 5 at 100~400° C. showed an increase rate of 206% compared to the average ZT value of Comparative Example 1.

The invention claimed is:

1. A chalcogen-containing compound represented by the following Chemical Formula 1:

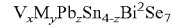 [Chemical Formula 1]

$$V_xM_yPb_zSn_{4-z}Bi^2Se_7$$

wherein, in Chemical Formula 1, V is a vacancy, M is an alkali metal, x, y, z, and 4−z are mole ratios of V, M, Pb, and, Sn, respectively, x is greater than 0 and less than 1, y is greater than 0 and less than 1, x+y is greater than 0 and equal to or less than 1, z is greater than 0 and equal to or less than 4, and x+y+z is greater than 0 and equal to or less than 5.

2. The chalcogen-containing compound according to claim 1, wherein M is one or more alkali metals selected from the group consisting of Li, Na, and K.

3. The chalcogen-containing compound according to claim 1, wherein the compound has a crystal structure of a face-centered cubic lattice structure.

4. The chalcogen-containing compound according to claim 3, wherein the vacancy (V) is a vacant site excluding the sites filled with Se, Sn, Pb and Bi in the face-centered cubic lattice structure, and M is filled in a part of the vacancy (V).

5. The chalcogen-containing compound according to claim 3, wherein
the Se fills anion sites of the face-centered cubic lattice structure,
the Sn, the Pb and the Bi fill cation sites of the face-centered cubic lattice structure,
the vacancy (V) is a vacant site of remaining cation sites, excluding the sites filled with Sn, Pb, and Bi, and
the M is filled in a part of the vacancy (V).

6. The chalcogen-containing compound according to claim 3, wherein the Pb is substituted at the Sn site, in the face-centered cubic lattice structure.

7. The chalcogen-containing compound according to claim 1, wherein the compound is used as thermoelectric conversion material.

8. A method for preparing the chalcogen-containing compound of claim comprising the steps of:
melting a mixture comprising raw materials of Sn, Pb, Bi, Se, and an alkali metal (M);
heat treating the molten mixture;
grinding the heat treated product; and
sintering the ground product.

9. The method for preparing a chalcogen-containing compound according to claim 8, wherein the melting is performed at a temperature of 750 to 900° C.

10. The method for preparing a chalcogen-containing compound according to claim 8, wherein the heat treatment is performed at a temperature of 500 to 650° C.

11. The method for preparing a chalcogen-containing compound according to claim 8, further comprising a step of cooling the product of the heat treatment step to form an ingot, between the heat treatment step and the grinding step.

12. The method for preparing a chalcogen-containing compound according to claim 8, wherein the sintering step is performed by a spark plasma sintering method.

13. The method for preparing a chalcogen-containing compound according to claim 8, wherein the sintering step is performed at a temperature of 550 to 700° C. and a pressure of 10 to 130 MPa.

14. A thermoelectric element comprising the chalcogen-containing compound according to claim 1, as a thermoelectric conversion material.

* * * * *